(12) United States Patent
Evans et al.

(10) Patent No.: US 11,247,298 B2
(45) Date of Patent: *Feb. 15, 2022

(54) METHOD OF FORMING A PLURALITY OF GRATINGS

(71) Applicant: Applied Materials, Inc., Santa Clara, CA (US)

(72) Inventors: Morgan Evans, Manchester, MA (US); Joseph C. Olson, Beverly, MA (US); Rutger Meyer Timmerman Thijssen, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 9 days.

This patent is subject to a terminal disclaimer.

(21) Appl. No.: 16/716,997

(22) Filed: Dec. 17, 2019

(65) Prior Publication Data

US 2020/0192031 A1    Jun. 18, 2020

Related U.S. Application Data

(60) Provisional application No. 62/780,802, filed on Dec. 17, 2018.

(51) Int. Cl.
   *G02B 5/18*    (2006.01)
   *B23K 26/34*   (2014.01)
   (Continued)

(52) U.S. Cl.
   CPC .......... *B23K 26/34* (2013.01); *C04B 41/0036* (2013.01); *G02B 5/1819* (2013.01);
   (Continued)

(58) Field of Classification Search
   None
   See application file for complete search history.

(56) References Cited

U.S. PATENT DOCUMENTS

| 6,930,834 B2 * | 8/2005 | Ogusu | C23F 1/02 359/571 |
|---|---|---|---|
| 9,287,148 B1 | 3/2016 | Evans et al. | |

(Continued)

FOREIGN PATENT DOCUMENTS

| JP | 08029606 A | 2/1996 |
|---|---|---|
| TW | 201820422 A | 6/2018 |

OTHER PUBLICATIONS

International Search Report/ Written Opinion issued to PCT/US2019/066812 dated Apr. 29, 2020.

(Continued)

*Primary Examiner* — Shamim Ahmed
(74) *Attorney, Agent, or Firm* — Patterson + Sheridan, LLP

(57) ABSTRACT

Embodiments of the present application generally relate to methods for forming a plurality of gratings. The methods generally include depositing a material over one or more protected regions of a waveguide combiner disposed on a substrate, the material having a thickness inhibiting removal of a grating material disposed on the waveguide combiner when an ion beam is directed toward the substrate, and directing the ion beam toward the substrate. The methods disclosed herein allow for formation of a plurality of gratings in one or more unprotected regions, while no gratings are formed in the protected regions.

20 Claims, 8 Drawing Sheets

(51) Int. Cl.
    *C04B 41/00*     (2006.01)
    *G02B 6/34*     (2006.01)
    *G03F 7/00*     (2006.01)
    *F21V 8/00*     (2006.01)
    *G06F 3/01*     (2006.01)

(52) U.S. Cl.
    CPC ............ G02B 5/1857 (2013.01); G02B 6/34 (2013.01); G03F 7/0005 (2013.01); *G02B 6/0016* (2013.01); *G02B 6/0065* (2013.01); *G06F 3/011* (2013.01)

(56) References Cited

U.S. PATENT DOCUMENTS

| | | | |
|---|---|---|---|
| 10,684,407 B2 * | 6/2020 | Mohanty | H01J 37/321 |
| 10,690,821 B1 * | 6/2020 | Evans | H01L 21/31105 |
| 10,823,888 B1 * | 11/2020 | Evans | G02B 6/02138 |
| 2007/0263973 A1 | 11/2007 | Van Laere et al. | |
| 2011/0135557 A1 * | 6/2011 | Rangarajan | H01L 21/31144 423/345 |
| 2015/0333360 A1 * | 11/2015 | Tajima | H01M 10/058 429/7 |
| 2016/0035539 A1 | 2/2016 | Sainiemi et al. | |
| 2017/0003504 A1 | 1/2017 | Vallius et al. | |
| 2018/0059297 A1 | 3/2018 | Peroz et al. | |
| 2018/0095201 A1 | 4/2018 | Melli et al. | |
| 2019/0212480 A1 | 7/2019 | Evans et al. | |
| 2019/0258008 A1 | 8/2019 | Hautala et al. | |
| 2019/0324202 A1 * | 10/2019 | Colburn | G02B 5/1809 |

OTHER PUBLICATIONS

Taiwan Office Action issued in 108146227 dated Jul. 29, 2020.
Ormostamp for Polymer Working Stamps Data Sheet, https://www.microresist.de/sites/default/files/download/PI_OrmoStamp_2015.pdf.
Ormocomp Data Sheet, https://www.microresist.de/sites/default/files/download/PI_OrmoComp_OrmoClearFX_2015_0.pdf.

* cited by examiner

METHOD OF FORMING A PLURALITY OF GRATINGS

CROSS-REFERENCE TO RELATED APPLICATIONS

This application claims priority to U.S. Provisional Patent Application No. 62/780,802, filed Dec. 17, 2018, which is hereby incorporated by reference in its entirety.

BACKGROUND

Field

Embodiments of the present application relate to a method and, more specifically, to a method of forming a plurality of gratings.

Description of the Related Art

Virtual reality is generally considered to be a computer generated simulated environment in which a user has an apparent physical presence. A virtual reality experience can be generated in three dimensions (3D) and viewed with a head-mounted display (HMD), such as glasses or other wearable display devices that have near-eye display panels as lenses to display a virtual reality environment that replaces an actual environment.

Augmented reality, however, enables an experience in which a user can still see through the display lenses of the glasses or other HMD device to view the surrounding environment, yet also see images of virtual objects that are generated for display and appear as part of the environment. Augmented reality can include any type of incoupling, such as audio and haptic incouplings, as well as virtual images, graphics, and video that enhances or augments the environment that the user experiences.

A virtual image is overlaid on an ambient environment to provide an augmented reality experience to the user. Waveguides are used to assist in overlaying images. Generated light is propagated through a waveguide until the light exits the waveguide and is overlaid on the ambient environment. In some implementations, multiple waveguides are stacked or otherwise combined to form an optical device, such as a display lens. Each waveguide or waveguide combiner includes substrates with different grating regions.

One drawback in the art is that manufacturing different gratings on the same substrate is a time-consuming process. Different mask steps and methods are needed in photolithography in order to manufacture gratings with different material properties, such as grating orientations and grating depths. In addition, some photolithography methods do not have the capability to make varying spacing and depth profiles of gratings in the different waveguides.

Therefore, what is needed is a manufacturing process that allows formation of grating regions with different grating profiles.

SUMMARY

Embodiments herein include methods of forming pluralities of gratings. The methods allow for faster and less expensive formation of waveguides with different grating profiles.

In one embodiment, a method of forming a first plurality of gratings is provided. The method includes depositing a protective material over one or more first regions of a waveguide combiner disposed on a substrate, the protective material having a first thickness such that the protective material at least partially inhibits removal of a grating material disposed on the waveguide combiner when an ion beam is directed toward the substrate, and directing the ion beam toward the substrate such that at least a portion of the grating material from the one or more first regions of the waveguide combiner is removed such that the first plurality of gratings is formed. At least one of the first gratings of the plurality of gratings has an angle of about 5° to about 85°.

In another embodiment, a method of forming a plurality of gratings is provided. The method includes depositing a protective material over one or more protected regions of a waveguide combiner disposed on a substrate, the protective material having a thickness inhibiting removal of a grating material disposed on the waveguide combiner when an ion beam is directed toward the substrate, directing the ion beam toward the substrate such that at least a portion of the grating material from one of one or more unprotected regions of the waveguide combiner is removed such that the plurality of gratings is formed, and removing the protective material over the one or more protected regions. The one or more unprotected regions are configured to receive incident beams of light from a microdisplay. At least one of the gratings of the plurality of gratings has an angle of about 5° to about 85°.

In yet another embodiment, a method of forming a first plurality of gratings is provided. The method includes depositing a protective material over one or more protected regions of a waveguide combiner disposed on a substrate, the protective material having a thickness inhibiting removal of a grating material disposed on the waveguide combiner when an ion beam is directed toward the substrate, depositing the protective material on at least a portion of one of the unprotected regions, directing the ion beam toward the substrate such that at least a portion of the grating material from one of one or more unprotected regions of the waveguide combiner is removed such that the first plurality of gratings is formed, and removing the protective material over the one or more protected regions. The first plurality of gratings has a profile with two different depths. At least one of the gratings of the plurality of gratings has an angle of about 5° to about 85°. The depositing the protective material on at least a portion of one of the unprotected regions comprises exposing the material to a plurality of heating pixels or light-emitting diodes (LEDs).

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present application generally relate to methods for forming a plurality of gratings. The methods generally include depositing a material over one or more protected regions of a waveguide combiner disposed on a substrate, the material having a thickness inhibiting removal of a grating material disposed on the waveguide combiner when an ion beam is directed toward the substrate, and directing the ion beam toward the substrate. The methods disclosed herein allow for formation of a plurality of gratings, or fins, in one or more unprotected regions, while no gratings are formed in the protected regions. Embodiments disclosed herein may be useful for, but are not limited to, formation of a plurality of gratings for a waveguide.

As used herein, the term "about" refers to a +/−10% variation from the nominal value. It is to be understood that such a variation can be included in any value provided herein.

Figure 1A:
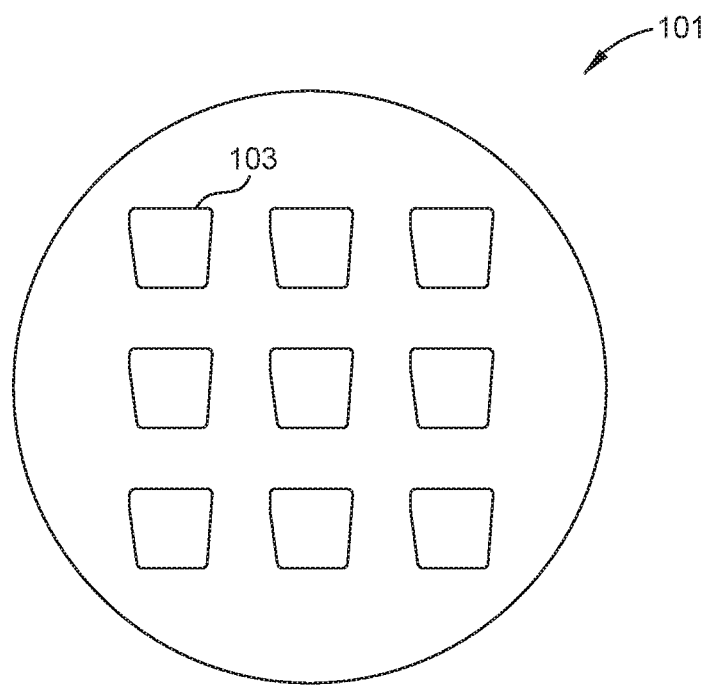
FIG. 1A illustrates a perspective frontal view of a substrate, according to one embodiment.

FIG. 1A illustrates a perspective frontal view of a substrate 101, according to one embodiment. The substrate 101 is configured to be used in an optical device. The substrate 101 can be any substrate used in the art. For example, the substrate 101 includes a semiconducting material, e.g., silicon (Si), germanium (Ge), silicon germanium (SiGe), and/or a III-V semiconductor such as gallium arsenide (GaAs). In another example, the substrate 101 includes a transparent material, e.g., glass and/or plastic. The substrate 101 can have any number of insulating, semiconducting, or metallic layers thereon.

As shown, the substrate 101 includes a plurality of waveguide combiners 103 disposed thereon. The plurality of waveguide combiners 103 are disposed on the substrate 101 in a grid of rows and columns. It is contemplated that other suitable arrangements of disposing the plurality of waveguide combiners 103 on the substrate 101 can be implemented according to the embodiments described herein.

Figure 1B:
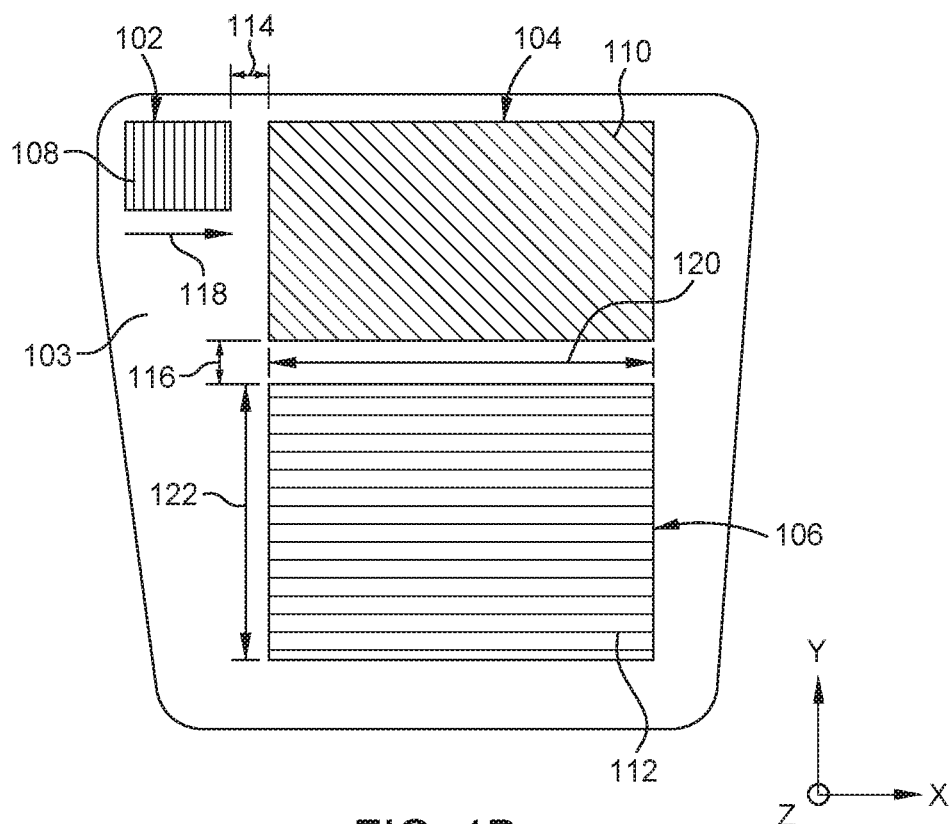
FIG. 1B illustrates a perspective frontal view of a waveguide combiner, according to one embodiment.

FIG. 1B illustrates a perspective frontal view of the waveguide combiner 103, according to one embodiment. The waveguide combiner 103 is configured to guide electromagnetic radiation (e.g., light). As shown, the waveguide combiner 103 includes a plurality of regions each including a plurality of gratings, or fins, such as an incoupling region 102 defined by a plurality of incoupling gratings 108, an intermediate region 104 defined by a plurality of intermediate gratings 110, and an output coupling region 106 defined by a plurality of output gratings 112.

The incoupling region 102 is configured to receive incident beams of light (a virtual image) having an intensity from a microdisplay. Each grating of the plurality of incoupling gratings 108 of the incoupling region 102 splits the incident beams into a plurality of modes, each beam having a mode. Zero-order mode ($T_0$) beams are reflected or transmitted. Positive first-order mode ($T_1$) beams undergo total internal-reflection (TIR) through the waveguide combiner 103 to the output coupling region 106. Negative first-order mode ($T-1$) beams propagate in the waveguide combiner 103 in a direction opposite to the $T_1$ beams.

In embodiments described herein, which can be combined with other embodiments described herein, a minimum distance 114 between the incoupling region 102 and the intermediate region 104 is maintained during deposition of the waveguide combiners 103, and a minimum distance 116 between the intermediate region 104 and the output coupling region 106 is maintained during deposition of the waveguide combiners 103. For example, the minimum distance 114 and the minimum distance 116 are less than about 1 mm. In embodiments described herein, which can be combined with other embodiments described herein, the plurality of incoupling gratings 108 have a distribution of depths 118, the plurality of intermediate gratings 110 have a distribution of depths 120, and the plurality of incoupling gratings 108 have a distribution of depths 122. For example, depths of the plurality of incoupling gratings 108 having the distribution of depths 118 increase in an x-direction, depths of the plurality of intermediate gratings 110 having the distribution of depths 120 increase in the x-direction, and depths of the plurality of output gratings 112 having the distribution of depths 122 increase in a y-direction.

Figure 2A:
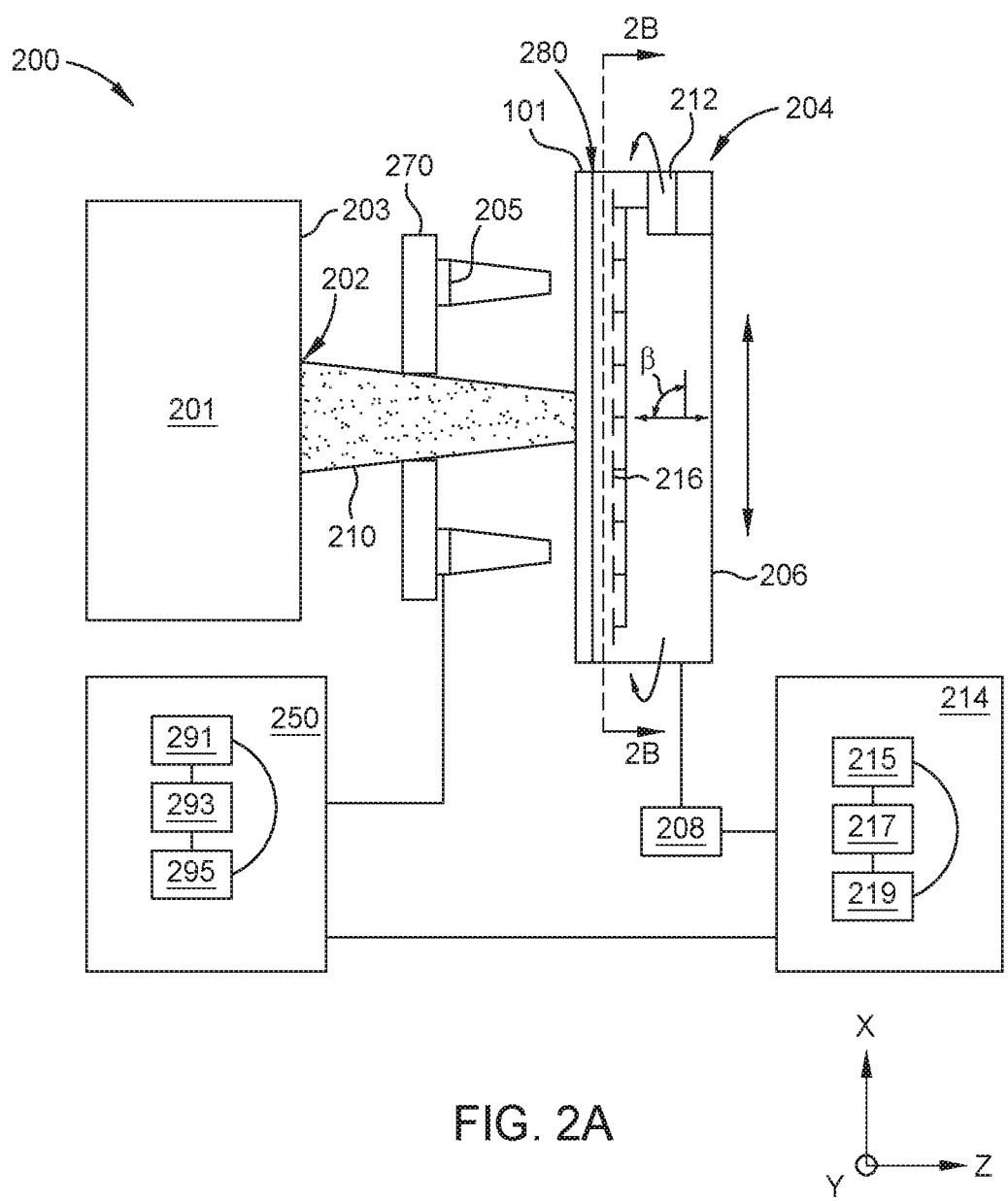
FIG. 2A illustrates a schematic cross-sectional view of a system, according to one embodiment.

FIG. 2A illustrates a schematic cross-sectional view of a system 200, according to one embodiment. The system 200 is configured to etch portions of a substrate (e.g., substrate 101) using an ion beam 210. The system 200 can include any ion beam system used in the art, such as ion beam etching, focused ion beam etching, electron beam etching, reactive ion beam etching, full-wafer ion systems, and the like. As shown, the system 200 includes a substrate support assembly 204, an ion source 201, an extraction electrode 270 having light emitting diode (LED) arrays 205, a controller 214, a secondary controller 250, a plurality of heating pixels 216, and a power source 212. It is to be understood that the system described below is an exemplary system and other systems can be used with or modified to accomplish aspects of the present disclosure.

The ion source 201 is configured to emit ions in a controlled fashion incident on a surface of the substrate 101. As shown, the ion source 201 includes an extraction aperture 202. The ions are extracted from the ion source 201 through the extraction aperture 202 as the ion beam 210. The extraction aperture 202 is located on a side 203 of the ion source 201 that is closest to the substrate 101. The ion beam 210 is directed toward the substrate 101. The ion beam 210 can be a ribbon beam, a spot beam, or full substrate-size beam.

Figure 2B:
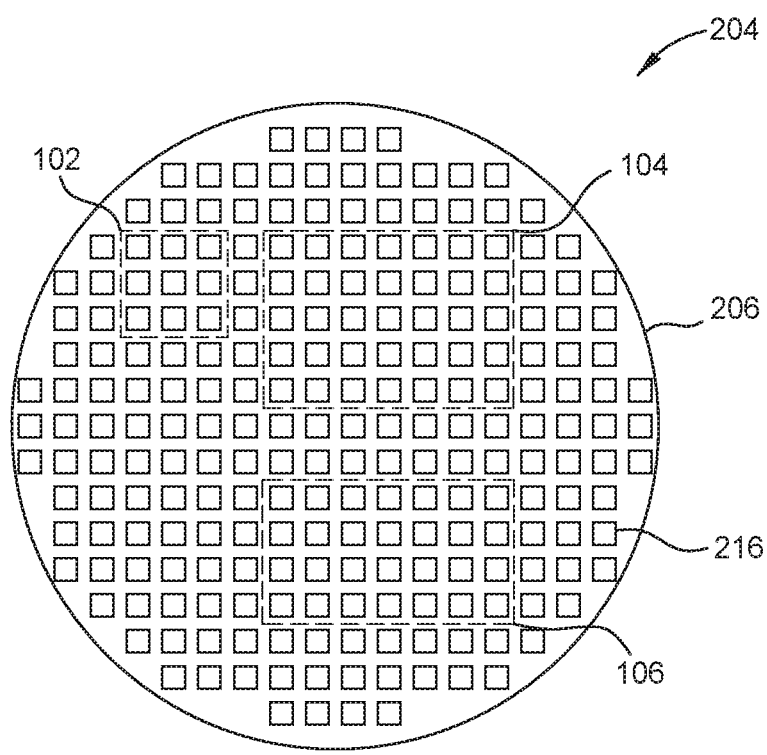
FIG. 2B illustrates a perspective frontal view of a substrate support assembly, according to one embodiment.

The substrate support assembly 204 is configured to retain the substrate 101 on a support surface 280. As shown, the substrate support assembly 204 includes a body 206 and an actuator 208. The body 206 of the substrate support assembly 204 is coupled to the actuator 208. The actuator 208 is configured to move the body 206 in a scanning motion along the x-direction and/or the y-direction. In one embodiment, which can be combined with other embodiments described herein, the actuator 208 is configured to tilt the body 206 such that the substrate 101 is positioned at a tilt angle β relative to the z-axis of the ion source 201. In another embodiment, which can be combined with other embodiments described herein, the actuator 208 is configured to rotate the substrate 101 about the x-axis of the body 206. FIG. 2B illustrates a perspective frontal view of the substrate support assembly 204, according to one embodiment.

The controller 214 is configured to control and automate the system 200. As shown, the controller 214 includes a central processing unit (CPU) 215, memory 217, and support circuits (or I/O) 219. The CPU 215 is one of any form of computer processors that are used in industrial settings for controlling various processes and hardware (e.g., pattern generators, motors, and other hardware) and monitor the processes (e.g., processing time and substrate position or location). The memory 217 is connected to the CPU 215, and is one or more of a readily available memory, such as random access memory (RAM), read only memory (ROM), floppy disk, hard disk, or any other form of digital storage, local or remote. Software instructions and data can be coded and stored within the memory 217 for instructing the CPU 215. The support circuits 219 are also connected to the CPU 215 for supporting the CPU in a conventional manner. The support circuits 219 include conventional cache, power supplies, clock circuits, incoupling/output circuitry, subsystems, and the like.

The secondary controller 250 is configured to control and automate the LED arrays 205. As shown, the secondary controller 250 includes a central processing unit (CPU) 291, memory 293, and support circuits (or I/O) 295. The CPU 291 is one of any form of computer processors that are used in industrial settings for controlling various processes and hardware (e.g., pattern generators, motors, and other hardware) and monitor the processes (e.g., processing time and substrate position or location). The memory 293 is connected to the CPU 291, and is one or more of a readily available memory, such as random access memory (RAM), read only memory (ROM), floppy disk, hard disk, or any other form of digital storage, local or remote. Software instructions and data can be coded and stored within the memory 293 for instructing the CPU 291. The support circuits 295 are also connected to the CPU 291 for supporting the CPU in a conventional manner. The support circuits 295 include conventional cache, power supplies, clock circuits, incoupling/output circuitry, subsystems, and the like.

A program (or computer instructions) readable by the controller 214 and/or the secondary controller 250 determines which tasks are performable by the system 200. The controller 214 is configured to communicate and control the power source 212, the actuator 208, and the secondary controller 250. The controller 214 and the secondary controller 250 are configured to control aspects of the substrate support assembly 204 during processing. The plurality of heating pixels 216 are disposed in the body 206 and are coupled to the power source 212. The controller 214 is operable to individually control the each of the heating pixels 216, such that temperature distributions are provided on the back-side of the substrate 101, (i.e., the side of the substrate 101 retained on the support surface 280), to correspond to at least one of the incoupling region 102, the intermediate region 104, and the output coupling region 106.

The LED arrays 205 are configured to heat portions of the substrate 101. The LED arrays 205 are disposed on the side 203 of the ion source 201, on the surface that is closest to the substrate 101, proximate the extraction aperture 202. The widths of the LED arrays 205 extend into and out of the page, respectively.

Figure 2C:
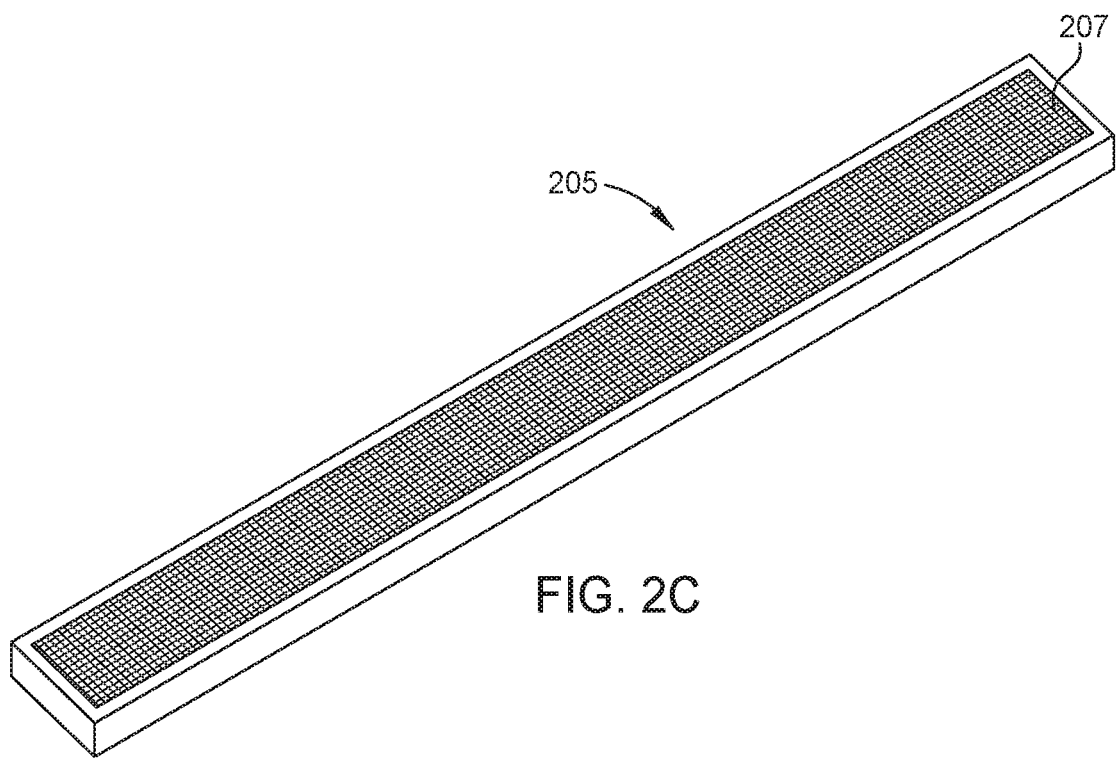
FIG. 2C illustrates a schematic view of an LED array, according to one embodiment.

FIG. 2C illustrates a schematic view of the LED array 205, according to one embodiment. As shown, the LED array 205 includes a plurality of individual LEDs 207 arranged in an array of rows and columns. Any number of rows and columns of LEDs 207 can be used. The secondary controller 250 is operable to individually control the each of the LEDs of the LED arrays 205, such that temperature distributions are provided on the front-side of the substrate 101.

Figure 3:
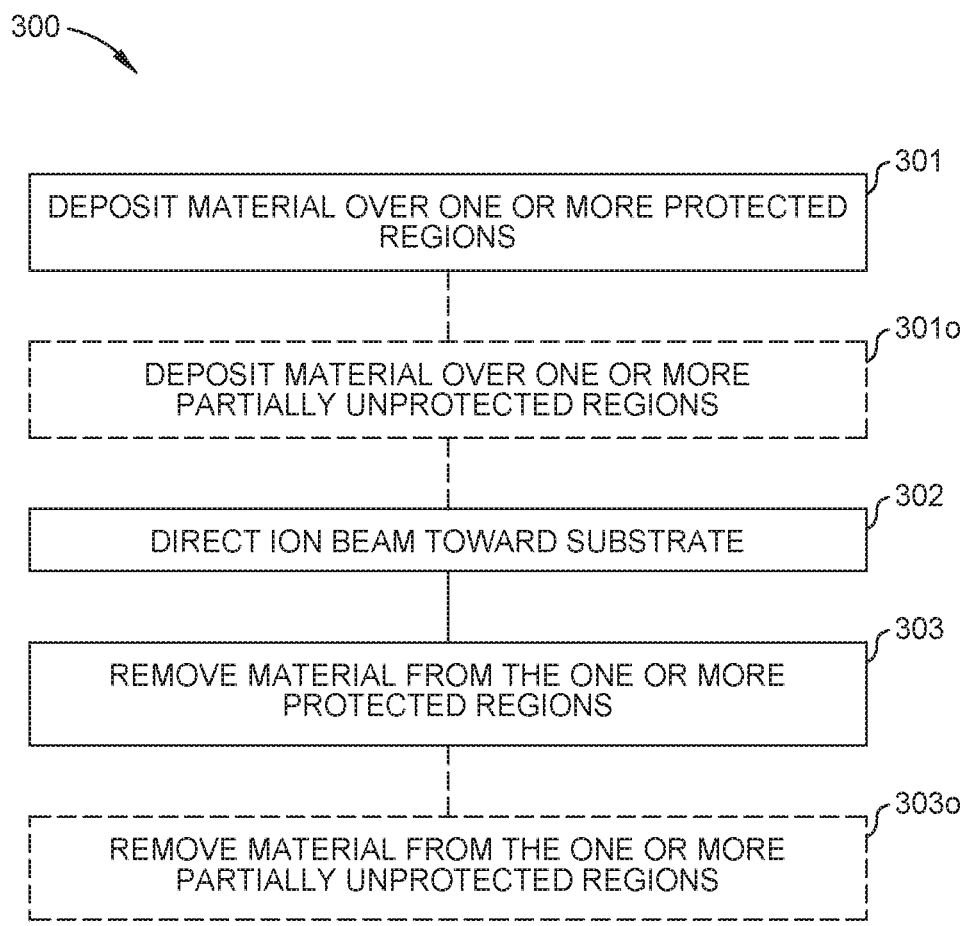
FIG. 3 is a flow diagram of method operations for fabricating a waveguide combiner, according to one embodiment.

FIG. 3 is a flow diagram of method 300 operations for fabricating a waveguide combiner (e.g., waveguide combiner 103). Although the method 300 operations are described in conjunction with FIGS. 4A-D, persons skilled in the art will understand that any system configured to perform the method operations, in any order, falls within the scope of the embodiments described herein. The method 300 can be stored or accessible to the controller 214 and/or secondary controller 250 as computer readable media containing instructions, that when executed by the CPU 215 of the controller and/or the CPU 291 of the secondary controller, cause the system 200 to perform the method 300.

The method 300 begins at operation 301, where a protective material is deposited over one or more protected regions (alternatively referred to as totally protected regions) of the substrate 101. The protective material is configured to protect the one or more protected regions from etching in operation 302, while still allowing etching of one or more unprotected regions. The one or more protected regions include the intermediate region 104 and the output coupling region 106, and the one or more unprotected regions includes the incoupling region 102, according to one embodiment. The unprotected regions can also include partially unprotected regions (i.e., portions of the regions are protected, and other portions of the regions are unprotected).

The material is deposited by one of inkjet printing or three-dimensional (3D) printing, according to one embodiment. The material can include photoresist materials. The photoresist materials can include, but are not limited to, diazonaphthoquinone, a phenol formaldehyde resin, poly (methyl methacrylate), poly(methyl glutarimide), and/or SU-8.

Figure 4A:
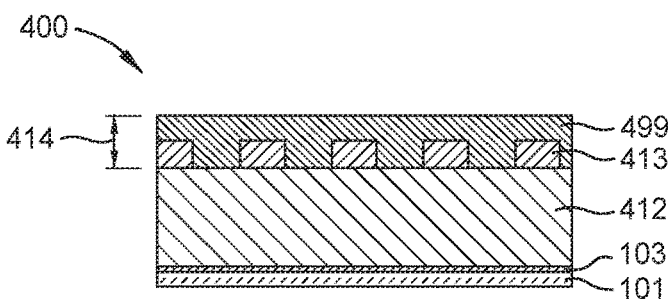
FIGS. 4A-4D illustrate schematic cross-sectional views of an unprotected region during a method of fabricating a waveguide combiner, according to one embodiment.

FIG. 4A illustrates a schematic cross-sectional view of a portion 400 of one of the one or more protected regions, according to one embodiment. The one or more protected regions include the intermediate region 104 and the output coupling region 106, according to one embodiment. A material 499 (e.g., the protective material described above) is disposed over a grating material 412 disposed on the waveguide combiners 103 of the substrate 101. A patterned hardmask 413 is disposed over the grating material 412. The grating material 412 can include silicon oxycarbide (SiOC), titanium oxide ($TiO_x$), $TiO_x$ nanomaterials, niobium oxide ($NbO_x$), niobium-germanium ($Nb_3Ge$), silicon dioxide ($SiO_2$), silicon oxycarbonitride (SiOCN), vanadium (IV) oxide ($VO_x$), aluminum oxide ($Al_2O_3$), indium tin oxide (ITO), zinc oxide (ZnO), tantalum pentoxide ($Ta_2O_5$), silicon nitride ($Si_3N_4$), silicon-rich $Si_3N_4$, hydrogen-doped $Si_3N_4$, boron-doped $Si_3N_4$, silicon carbon nitrate (SiCN), titanium nitride (TiN), zirconium dioxide ($ZrO_2$), germanium (Ge), gallium phosphide (GaP), poly-crystalline (PCD), nanocrystalline diamond (NCD), doped diamond containing materials, and any mixture of the above.

The material 499 can be deposited by 3D printing or inkjet printing. The material 499 has a thickness 414 that inhibits the removal of the grating material 412 when the ion beam 210 is directed toward the substrate 101.

At optional operation 3010, a material is deposited over at least a portion of the one or more partially unprotected regions of the substrate 101. The material is configured to partially protect the portion of the one or more partially unprotected regions from etching in operation 302, according to one embodiment.

At operation 302, an ion beam is directed incident on the substrate 101. Operation 302 can include ion beam etching, focused ion beam etching, and the like. In one embodiment, the ion beam (e.g., ion beam 210) is created by, and directed by, the system 200.

Figure 4B:
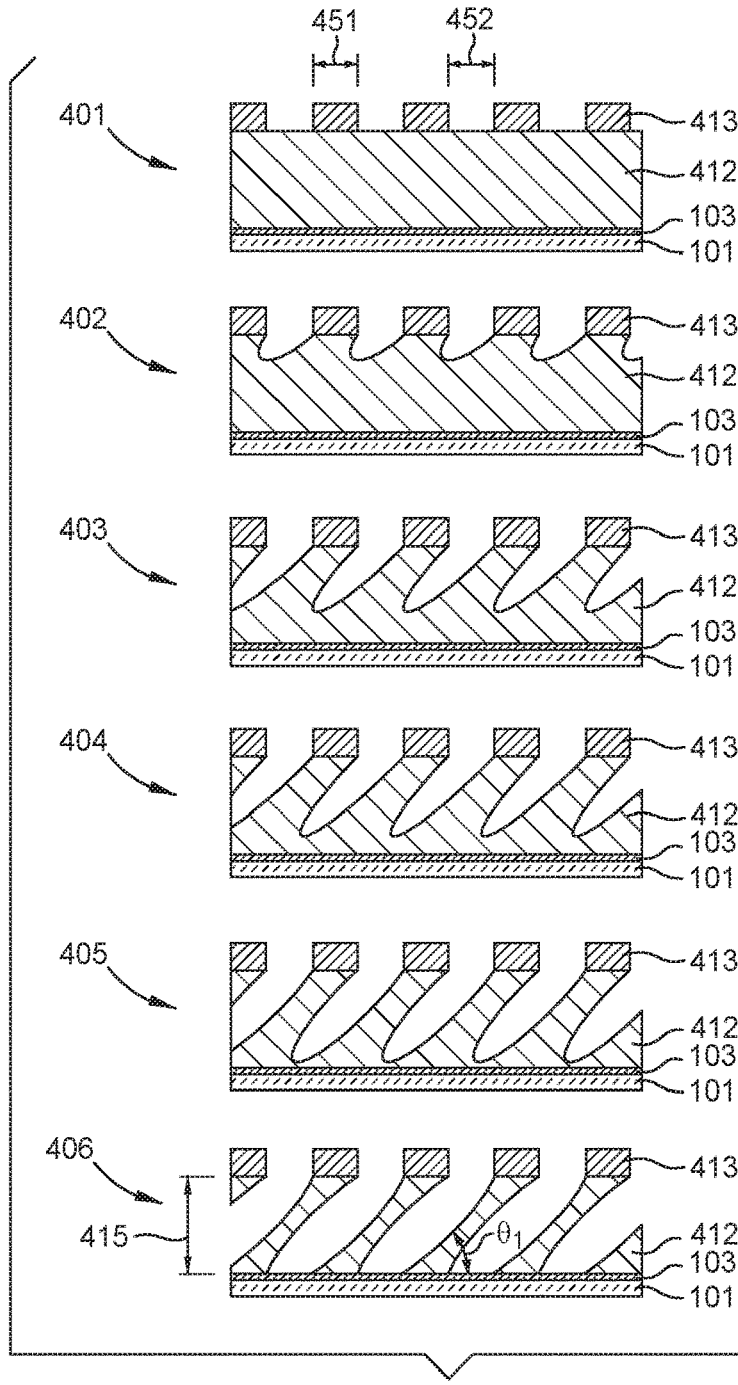

FIG. 4B illustrates schematic cross-sectional views of one of the one or more totally unprotected regions before, during, and after operation 302, according to one embodiment. In one embodiment described herein, which can be combined with other embodiments described herein, at operation 301, the material 499 is not deposited over the grating material 412 of the unprotected region. The unprotected region can be the incoupling region 102, according to one embodiment.

At operation 302, when the ion beam 210 is directed toward the substrate 101, the ion beam 210 forms, for example, by etching the plurality of incoupling gratings 108 in the grating material 412 exposed by the patterned hardmask 413 over a duration of time corresponding to periods 401-406. Because the thickness of the material 499 is uniform over the hardmask 413 in this example, each grating of the plurality of incoupling gratings 108 formed over the periods 401-406 have a same depth 415 at period 406. Thus, the entirety of the gratings of the plurality of incoupling gratings 108 can have about the same dimensions, and a consistently uniform grating profile is formed. Any of the gratings described herein have an angle θ that can vary from about 5° to about 85° (i.e., the gratings are angled with respect to a surface of the substrate 101).

Figure 4C:
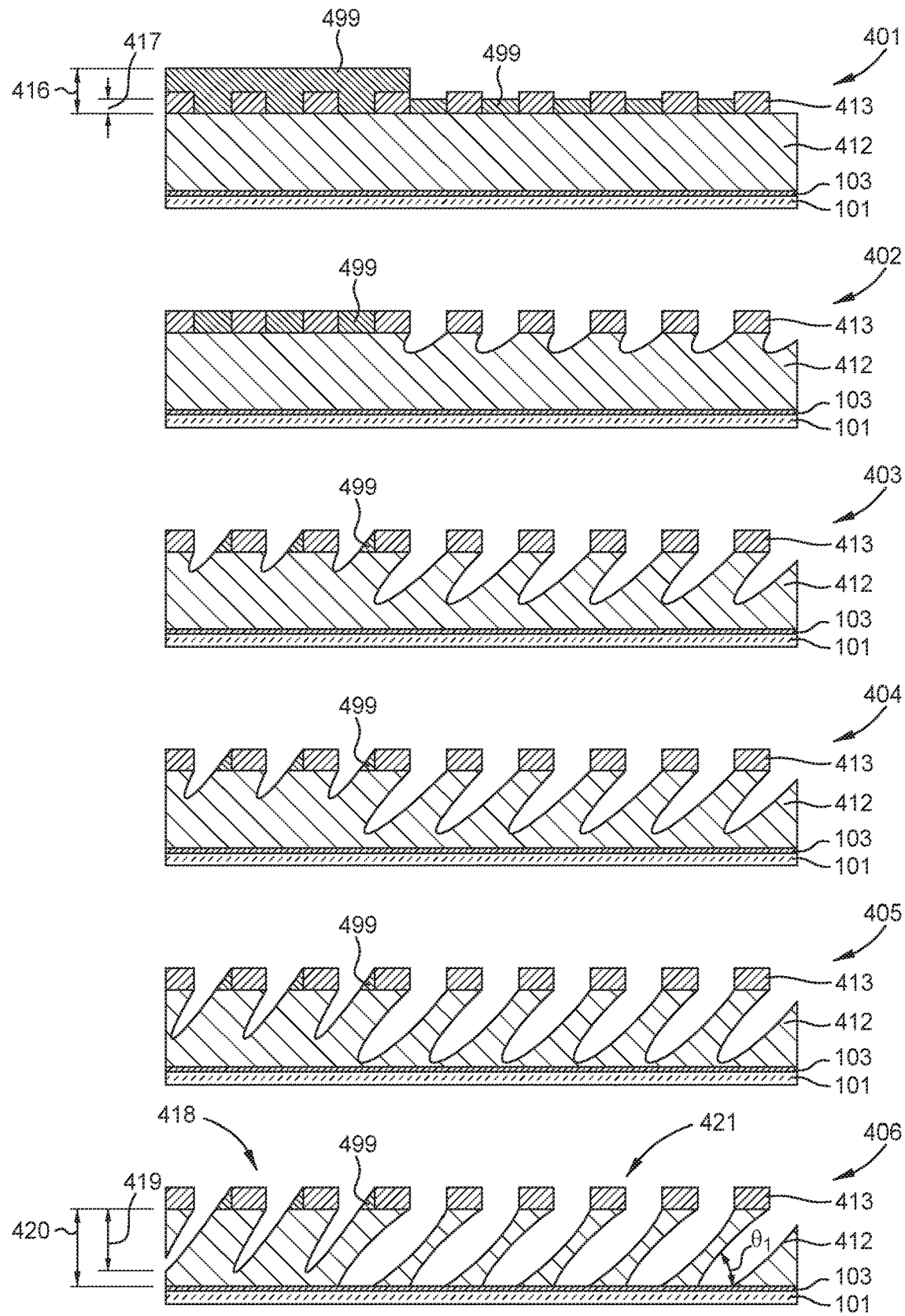

FIG. 4C illustrates schematic cross-sectional views of one of the one or more partially unprotected regions and totally unprotected regions before, during, and after operation 302, according to one embodiment. In the embodiment illustrated in FIG. 4C, optional operation 3010 is performed, and thus material 499 is disposed over at least a portion of the partially unprotected region. The material 499 has various regions of differing thickness, for example, first thickness 416 and second thickness 417. The second thickness 417 is less than the first thickness 416, such that at period 406 a first portion of gratings 418 corresponding to the first thickness has a depth 419 less than a depth 420 of a second portion of gratings 421 corresponding to the second thickness. Thus, different portions of the same plurality of gratings have different depth profiles, and a depth profile having two different depths is formed. In some embodiments, the first thickness 416 is about zero (i.e., little or no material is deposited in this portion). In some embodiments, the first thickness 416 is thick enough that no gratings are developed in this portion, and the region would be a totally protected region. In some embodiments, multiple thicknesses of the material (e.g., three or more thicknesses) is included.

The first portion of gratings 418 can have the depth 419 less than the depth 420 of the second portion of gratings 421 at period 406, where none of the material 499 has been deposited over the grating material 412 of the unprotected region.

In one embodiment described herein, which can be combined with other embodiments described herein, each of the heating pixels 216 can be individually controlled such that a temperature distribution corresponding to the partially unprotected region is provided to the back-side of the substrate 101. In some embodiments, portions of the material 499 that receive higher temperatures reacts faster than portions that receive lower temperatures. Thus, the high temperature portions are etched deeper, resulting in deeper gratings in the high temperature portions than the low temperature portions. In some embodiments, portions of the material 499 that receives higher temperature etches slower than portions that receive lower temperatures. Thus, the high temperature portions are etched shallower, resulting in shallower gratings in the high temperature portions than the low temperature portions. For example, if the portions of the material 499 are removed in an etching process, the increased temperature of the high temperature portions results in more removal of the material than the low temperature portions.

In another embodiment described herein, which can be combined with other embodiments described herein, individually controlling each of the LEDs of the LED arrays 205, such that a temperature distribution corresponding to the protected region is provided to the front-side of the substrate 101, results in the variations in etch rates. In some embodiments, a uniform material 499 is deposited over the protected region, and the depth of the formed gratings (e.g., gratings 418) is controlled by the dose of light applied by the LEDs. Depth of the formed gratings is controlled by increasing the dosing to certain portions of the material 499. In some embodiments, portions of the material 499 that receive higher doses of light etches faster than portions that receive lower doses of light. Thus, the high dose portions are etched deeper, resulting in deeper gratings in the high dose portion than the low dose portions. In some embodiments, portions of the material 499 that receive higher doses of light etches slower than portions that receive lower doses of light. Thus, the high dose portions are etched shallower, resulting in shallower gratings in the high dose portion than the low dose portions. In some embodiments, greyscale lithography is performed on the uniform material 499 to control the depth of the gratings (e.g., gratings 418).

Figure 4D:
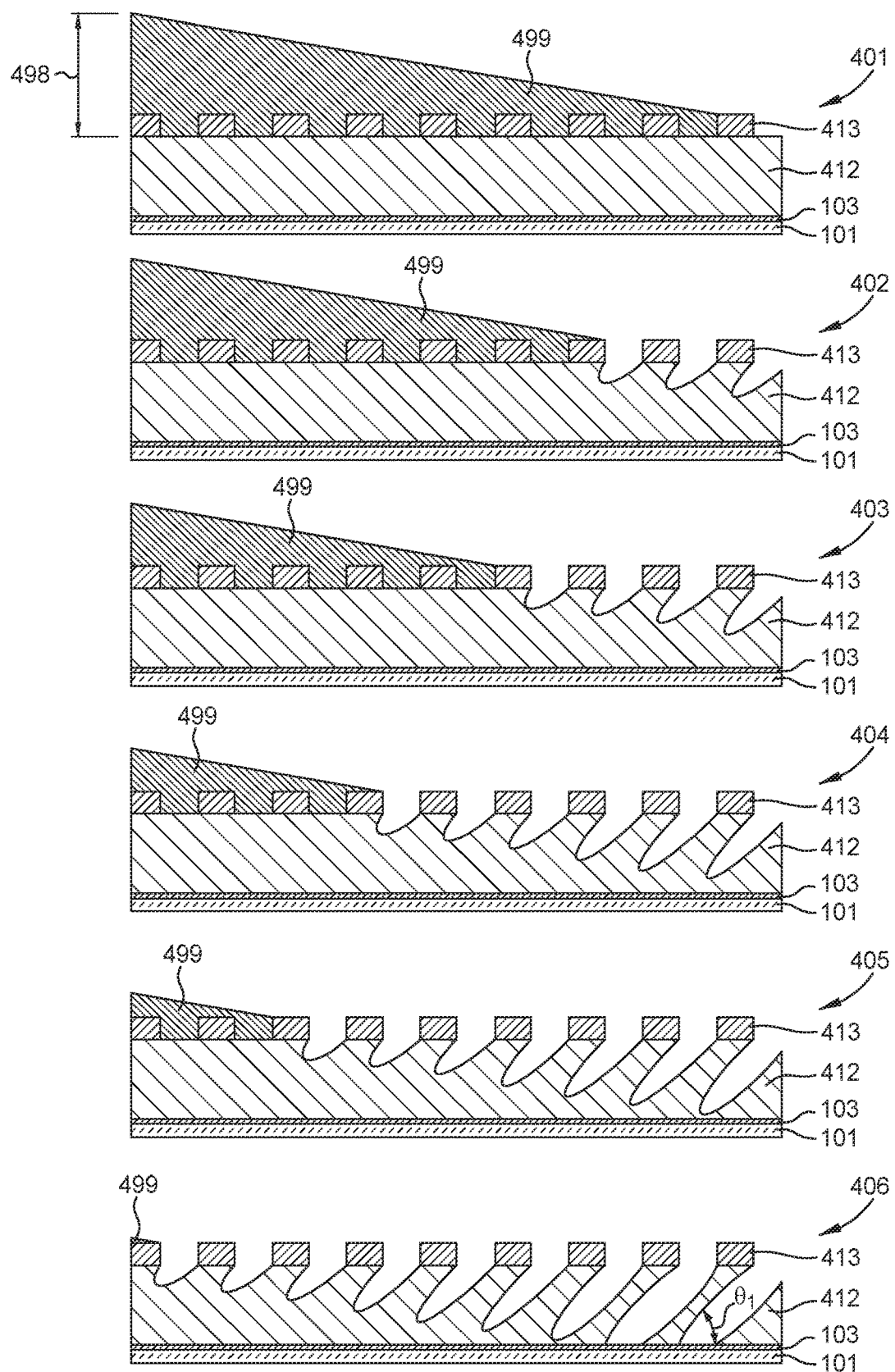

FIG. 4D illustrates schematic cross-sectional views of one of the one or more partially unprotected regions before, during, and after operation 302, according to one embodiment. In the embodiment illustrated in FIG. 4D, optional operation 3010 is performed, and thus material 499 is disposed over at least a portion of the partially unprotected region. The material 499 has a thickness 498 that varies with position. Thus, different portions of the same plurality of gratings can be formed that have different depth profiles which vary with the thickness of the material 499. The variation of the thickness 498 of the material 499 is linear, according to one embodiment; however, the thickness 498 may vary in any other manner, and may also vary in two dimensions over the plurality of gratings.

In any of the embodiments described above, elements of the patterned hardmask 413 can have different widths 451, and thus the fins of the resulting plurality of incoupling gratings 108 can have different widths. In any of the embodiments described above, elements of the patterned hardmask 413 can have different spacings 452, and thus the spacings between the fins of the resulting plurality of incoupling gratings 108 can be different. In any of the embodiments described above, elements of the patterned hardmask 413 can have different widths 451 and different spacings 452, and thus the fins of the plurality of incoupling gratings 108 have different widths and different spacings between the fins.

At operation 303, the material 499 is removed from the protected regions. In one embodiment, the protected regions include the intermediate region 104 and the output coupling region 106. The material can be removed using any standard method in the art, such as oxygen gas (O₂) ashing. Thus, a plurality of gratings (e.g., plurality of incoupling gratings 108) is formed in the unprotected region (e.g., the incoupling region 102), and no gratings are formed in the protected regions (e.g., the intermediate region 104 and the output coupling region 106).

At optional operation 303o, the material is removed from the partially unprotected regions, if any material is still remaining after the etching in operation 302. The material can be removed as described in operation 303 above.

In some embodiments, operations 301-303 are repeated, but the protected and unprotected regions are different from the previous operations 301-303. The protected regions include the incoupling region 102 and the output coupling region 106, and the unprotected region includes the intermediate region 104, according to one embodiment. The protected regions include the incoupling region 102 and the intermediate region 104, and the unprotected region includes the output coupling region 106, according to one embodiment. For each unprotected region, the method 300 can vary such that gratings of various thicknesses, widths, and profiles can be created (e.g., the incoupling region 102 has a plurality of incoupling gratings 108 formed in the embodiment illustrated in FIG. 4B, and the intermediate region 104 has a plurality of intermediate gratings 110 formed in the embodiment illustrated in FIG. 4C). In other embodiments, operations 301o and 303o are also repeated. Thus, method 300 allows for creation of different regions with different gratings characteristics.

Figure 5A:
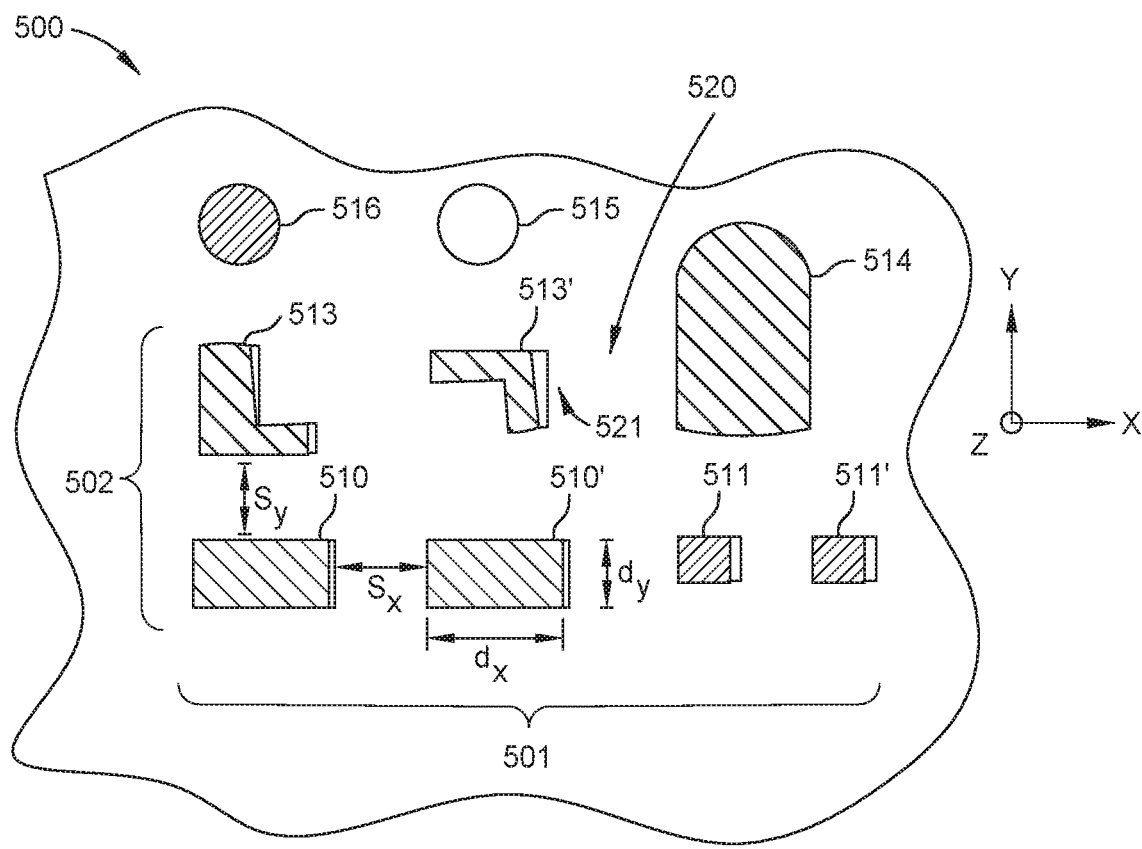
FIG. 5A illustrates a top view of an unprotected portion having a 2D array of gratings, according to one embodiment.
Figure 5B:
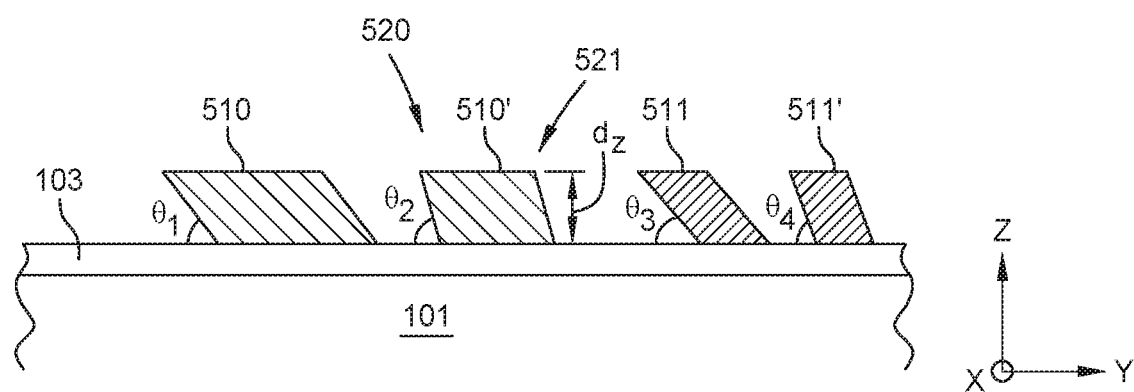
FIG. 5B illustrates a side view of an unprotected portion having a 2D array of gratings, according to one embodiment.

Although the description of method 300 above is illustrated by a 1-dimensional array of gratings (e.g., gratings 418), a 2-dimensional (2D) array of gratings can also be formed by the method 300. FIG. 5A illustrates a top view of an unprotected portion 500 having a 2D array 520 of gratings 521, according to one embodiment. FIG. 5B illustrates a side view of the unprotected portion 500 having the 2D array 520 of the gratings 521, according to one embodiment. As shown, the 2D array 520 has rows 501 and columns 502 of the gratings 521. Any number of rows 501 and columns 502 can be included in the 2D array 520. Although the 2D array 520 illustrated in FIG. 5A has the gratings 521 arranged in a grid pattern, any pattern can be utilized.

The critical dimension (CD) of the gratings 521 can be the same or different in the x-direction (e.g., x-width $d_x$) from one another. The CD of the gratings 521 can be the same or different in the y-direction (e.g., y-width $d_y$) from one another. The critical dimension (CD) of the gratings 521 can be the same or different in the z-direction (e.g., z-width $d_z$) from one another. The CD of the gratings 521 can be the same or different in the y-direction (e.g., y-width $d_y$) from one another. The angles $\theta_1$, $\theta_2$, $\theta_3$, $\theta_4$ of the gratings 521 can be the same or different from one another.

The inter-grating spacing between individual gratings 521 can be the same or different in the x-direction (e.g., x-distance $s_x$) from one another. The inter-grating spacing between individual gratings 521 can be the same or different in the y-direction (e.g., y-distance $s_y$) from one another.

The gratings 521 can have rectangular shapes (e.g., gratings 510, 510'), square shapes (e.g., gratings 511, 511'), L-shapes (e.g., gratings 513, 513'), circular shapes (e.g., grating 516), and/or island shapes (e.g., 514). Any combination of any shape of gratings 521 can be included. Although examples of gratings 251 shapes are given, any other possible shape is contemplated. The gratings 521 can also include voids 515 (i.e., penetration into the underlying substrate 101).

As described above, a method for forming a plurality of gratings is provided. The method includes depositing a material over one or more protected regions of a waveguide combiner disposed on a substrate, the material having a thickness inhibiting removal of a grating material disposed on the waveguide combiner when an ion beam is directed toward the substrate. The methods disclosed herein allow for formation of a plurality of gratings in one or more unprotected regions, while no gratings are formed in the protected regions.

While the foregoing is directed to examples of the present disclosure, other and further examples of the disclosure may be devised without departing from the basic scope thereof, and the scope thereof is determined by the claims that follow.

What is claimed is:

1. A method of forming a first plurality of gratings, comprising:
   depositing a protective material between portions of a patterned hardmask, the patterned hardmask disposed over a grating material, the protective material having a thickness from a planar top surface of the grating material to an upper surface of the protective material, the thickness of the protective material varying along the planar top surface of the grating material such that the thickness of the protective material at least partially inhibits removal of the grating material when an ion beam is directed toward the grating material; and
   directing the ion beam toward the grating material such that at least a portion of the grating material is removed such that the first plurality of gratings is formed having a depth profile that corresponds with the thickness of the protective material such that at least two gratings of the first plurality of gratings have different depths than each other, at least one of the gratings of the first plurality of gratings has an angle of about 5° to about 85°.

2. The method of claim 1,
   wherein the depositing the protective material includes depositing the protective material over a first portion and a second portion of the grating material such that the protective material with the thickness totally inhibits removal of the grating material in the first portion; and
   removing the protective material over the second portion.

3. The method of claim 2, wherein
   the protective material disposed over the first portion is thicker than the protective material disposed over the second portion.

4. The method of claim 1, wherein the thickness of the protective material varies in two dimensions over the first plurality of gratings.

5. The method of claim 1, wherein the thickness of the protective material varies linearly across the grating material.

6. The method of claim 1, wherein at least one of the gratings of the first plurality of gratings has a different height than other gratings of the first plurality of gratings.

7. A method of forming a plurality of gratings, comprising:
   depositing a protective material over a first portion of a grating material, the first portion adjacent to a second portion of the grating material, the protective material disposed between portions of a patterned hardmask on the first portion, the patterned hardmask disposed over the grating material, the protective material comprising:
  a thickness from a planar top surface of the grating material to an upper surface of the protective material, the thickness of the protective material inhibiting removal of the first portion of the grating material when an ion beam is directed toward the grating material; and
directing the ion beam toward the first portion and the second portion of the grating material such that the plurality of gratings is formed, wherein:
  a first plurality of gratings is formed in the first portion and a second plurality of gratings is formed in the second portion, the first plurality of gratings having a first depth that is less than a second depth of the second plurality of gratings, the first depth corresponding to the thickness of the protective material; and
  at least one grating of the first plurality of gratings or the second plurality of gratings has an angle of about 5° to about 85°.

8. The method of claim 7, further comprising:
depositing the protective material on the second portion of the grating material.

9. The method of claim 8, wherein
the protective material disposed over the first portion is thicker than the protective material disposed over the second portion.

10. The method of claim 8, wherein the protective material disposed over the second portion has a second thickness that varies across the grating material.

11. The method of claim 10, wherein the thickness of the protective material disposed over the first portion varies linearly across the grating material.

12. The method of claim 7, wherein at least one of the gratings of the first plurality of gratings has a different thickness than other gratings of the first plurality of gratings.

13. The method of claim 7, wherein
the depositing the protective material, and the directing the ion beam is repeated.

14. A method of forming a first plurality of gratings, comprising:
depositing a protective material over a first portion and a second portion of a grating material, the first portion adjacent to the second portion of the grating material, the protective material disposed between portions of a patterned hardmask on the first portion and the second portion, the patterned hardmask disposed over the grating material, the protective material comprising:
  a first thickness from a planar top surface of the first portion to an upper surface of the protective material, the first thickness of the protective material inhibiting removal of the first portion of the grating material when an ion beam is directed toward the first portion; and
  a second thickness from the planar top surface of the second portion to the upper surface of the protective material, the second thickness of the protective material inhibiting removal of the second portion of the grating material when an ion beam is directed toward the second portion; and
directing the ion beam toward the first portion and the second portion of the grating material such that the first plurality of gratings and a second plurality of gratings is formed, wherein:
  the first plurality of gratings is formed in the first portion and the second plurality of gratings is formed in the second portion, the first plurality of gratings having a first depth that is less than a second depth of the second plurality of gratings, the first depth corresponding to the first thickness and the second depth corresponding to the second thickness;
  at least one grating of the first plurality of gratings or the second plurality of gratings has an angle of about 5° to about 85°; and
  the depositing the protective material on the second portion comprises exposing the protective material to a plurality of heating pixels or light-emitting diodes (LEDs).

15. The method of claim 14, wherein each of the plurality of the heating pixels or LEDs is individually controlled.

16. The method of claim 15, wherein a temperature distribution corresponding to first portion is provided to a back-side of a substrate disposed under the orating material.

17. The method of claim 14, wherein at least one of the gratings of the first plurality of gratings has a different thickness than other gratings of the first plurality of gratings.

18. The method of claim 14, wherein the protective material comprises a photoresist.

19. The method of claim 18, wherein the protective material comprises SU-8.

20. The method of claim 14, wherein the depositing the protective material comprises inkjet printing or three-dimensional (3D) printing.

* * * * *